United States Patent
Carroll et al.

(10) Patent No.: US 8,390,395 B2
(45) Date of Patent: Mar. 5, 2013

(54) HIGH POWER RF SWITCH WITH ACTIVE DEVICE SIZE TAPERING

(75) Inventors: James M. Carroll, Allen, TX (US); John R. Stanton, Allen, TX (US); John G. Heston, Murphy, TX (US)

(73) Assignee: Raytheon Company, Waltham, MA (US)

( * ) Notice: Subject to any disclaimer, the term of this patent is extended or adjusted under 35 U.S.C. 154(b) by 312 days.

(21) Appl. No.: 12/772,903

(22) Filed: May 3, 2010

(65) Prior Publication Data

US 2011/0267154 A1    Nov. 3, 2011

(51) Int. Cl.
*H01P 1/15* (2006.01)
*H03L 5/00* (2006.01)

(52) U.S. Cl. .................. 333/103; 333/101; 327/308

(58) Field of Classification Search .............. 333/101, 333/103, 104; 327/419, 427, 429, 436, 308; 455/78

See application file for complete search history.

(56) References Cited

U.S. PATENT DOCUMENTS

| | | | |
|---|---|---|---|
| 5,012,123 A | | 4/1991 | Ayasli et al. |
| 7,173,471 B2 * | | 2/2007 | Nakatsuka et al. ........... 327/308 |
| 7,368,971 B2 | | 5/2008 | Pengelly |
| 7,459,988 B1 * | | 12/2008 | Iversen .................. 333/103 |
| 7,960,772 B2 * | | 6/2011 | Englekirk ................ 257/303 |
| 2006/0160520 A1 | | 7/2006 | Miyazawa |

OTHER PUBLICATIONS

Shifrin, M., et al., "High Power Control Components Using a New Monolithic FET Structure," IEEE 1989 Microwave and Millimeter-Wave Monolithic. Circuits Symposium, pp. 51-56.

* cited by examiner

*Primary Examiner* — Dean O Takaoka
(74) *Attorney, Agent, or Firm* — Christie, Parker & Hale, LLP

(57) ABSTRACT

In an improved T/R switch configuration of a radio transceiver, the sizes of active switches coupled in series between the receive port and the common port are tapered such that the voltage referenced to ground across the active devices of the T/R switch is more evenly distributed among the switches which increases the power handling capability of that path. According to one embodiment of the present invention, an RF switch includes a plurality of first switches coupled in series between a transmit port and a common port for transmitting an RF signal, and a plurality of second switches coupled in series between a receive port and the common port. At least two of the plurality of second switches have different sizes such that the at least two of the second switches have substantially the same nodal impedance with respect to a frequency of the RF signal and an RF ground.

24 Claims, 7 Drawing Sheets

HIGH POWER RF SWITCH WITH ACTIVE DEVICE SIZE TAPERING

BACKGROUND

1. Field

Aspects of embodiments of the present invention relate to radio-frequency (RF) transceivers, and, in particular, transmit-receive switching circuits of RF transceivers and a method of manufacturing the same.

2. Description of Related Art

An RF transceiver is a component of a wireless communication apparatus. The RF transceiver includes both a transmitter and a receiver in a single unit. When the transmitter and receiver share a common antenna for transmitting and receiving an RF signal, a transmit-receive (T/R) switch may be used to allow the transmitter and receiver to use the same antenna in a time-multiplexed fashion.

FIG. 1 is a block diagram illustrating an RF transceiver 100 including a T/R switch 101, a transmitter 103, and a receiver 105. In this RF transceiver embodiment, the T/R switch 101 functions as a single pole double throw device that connects an antenna 107 either to the transmitter 103 or to the receiver 105. In an implementation of the T/R switch 101, the considerations include size, cost, insertion loss, power handling, and power consumption of the switch. For example, the T/R switch 101 may be implemented as a solid state switch such as bipolar junction transistor (BJT), field effect transistor (e.g., J-FET, MOSFET, etc.) or PIN diode. A PIN diode is generally smaller and cheaper than a transistor; however, the PIN diode presents a high impedance to RF frequencies unless the PIN diode is biased with a DC bias current. As such, a switch implemented by PIN diode generally consumes more DC power than one implemented by a transistor such as a FET. When the PIN diode is biased with a DC bias current, the diode is turned on and provides a low resistance RF path between the anode and the cathode of the diode. On the other hand, a FET is controlled to turn on or off by applying a control voltage to its gate with insignificant DC gate current being drawn.

The RF transceiver may be implemented as an integrated circuit, where the active switches, (e.g., BJT and FET transistors or PIN diodes) of the T/R switch are typically stacked together in the shunt to ground in order to increase the high power handling capability through voltage division across the switches of the stack. However, in an integrated circuit, the active switches are not ideal circuits and each includes parasitic components depending on the structures and topologies of the active switches. Consequently, these parasitic components cause non-uniform voltage division among the active switches of the stack, thereby degrading the power handling capacity of the stack.

Known methods to equalize the voltages across the active switches utilize capacitors connected in parallel with the active switches to reduce the impedance of a particular switch and therefore reduce the voltage drop across the switch. However, these methods reply on discrete capacitors or separate capacitors that are monolithically attached across the terminals of each active switch (e.g., across a FET's drain and source terminals), thereby increasing the complexity, size, and cost of the switch circuit.

SUMMARY

Aspects of embodiments of the present invention are directed toward an improved T/R switch configuration of a radio transceiver. According to exemplary embodiments, the sizes of active switches coupled in series between the receive port and the common port are tapered such that the voltage referenced to ground across the active devices of the T/R switch is more evenly distributed among the switches which maximizes or increases the power handling capability of that path.

According to one embodiment of the present invention, an RF switch includes a plurality of first switches coupled in series between a transmit port and a common port for transmitting an RF signal, and a plurality of second switches coupled in series between a receive port and the common port. At least two of the plurality of second switches have different sizes such that the at least two of the second switches have substantially the same nodal impedance with respect to a frequency of the RF signal and an RF ground.

According to one aspect of the embodiment, the plurality of second switches may have different sizes to compensate for parasitic components of the second switches with respect to the RF signal and the RF ground.

According to one aspect of the embodiment, the plurality of second switches may be tapered in size from one of the second switches proximate to one of the receive port or the common port toward another one of the second switches proximate to the other one of the receive port or the common port.

According to one aspect of the embodiment, the plurality of second switches may be sized such that a voltage of the signal across the plurality of second switches is evenly divided while transmitting the RF signal.

According to one aspect of the embodiment, the plurality of second switches may include transistors.

According to one aspect of the embodiment, wherein the plurality of second switches may include PIN diodes.

According to one aspect of the embodiment, the integrated circuit RF switch may further include a plurality of third switches coupled in series between the transmit port and the RF ground. At least two of the plurality of third switches may have different sizes such that the at least two of the third switches have substantially the same nodal impedance with respect to the frequency of the RF signal.

According to one aspect of the embodiment, the plurality of third switches may have different sizes to compensate for parasitic components of the third switches with respect to the RF signal and the RF ground.

According to one aspect of the embodiment, the plurality of third switches may be tapered in size from one of the third switches proximate to one of the transmit port or the RF ground toward another one of the third switches proximate to the other one of the transmit port or the RF ground.

According to one aspect of the embodiment, the plurality of third switches may include transistors.

According to one aspect of the embodiment, the plurality of third switches may include PIN diodes.

According to one aspect of the embodiment, the plurality of third switches may be sized such that a voltage of the signal across the plurality of third switches is evenly divided while transmitting the RF signal.

According to one aspect of the embodiment, the first switches and the second switches may be discrete switches.

According to another embodiment of the present invention, a method of manufacturing an RF switch is provided. The method includes coupling a plurality of first switches in series between a transmit port and a common port for transmitting an RF signal, and coupling a plurality of second switches in series between a receive port and the common port. At least two of the plurality of second switches have different sizes such that the at least two of the second switches have substantially the same nodal impedance with respect to a frequency of the RF signal and an RF ground.

According to one aspect of the embodiment, the method may further include sizing the plurality of second switches differently to compensate for parasitic components of the second switches with respect to the RF signal and the RF ground.

According to one aspect of the embodiment, the method may further include tapering the plurality of second switches in size from one of the second switches proximate to one of the receive port or the common port toward another one of the second switches proximate to the other one of the receive port or the common port.

According to one aspect of the embodiment, the method may further include sizing the plurality of second switches such that a voltage of the RF signal across the plurality of second switches is evenly divided while transmitting the RF signal.

According to one aspect of the embodiment, the method may further include coupling a plurality of third switches in series between the transmit port and the RF ground. At least two of the plurality of third switches may have different sizes such that the at least two of the third switches have substantially the same nodal impedance with respect to the frequency of the RF signal.

According to one aspect of the embodiment, the method may further include sizing the plurality of third switches differently to compensate for parasitic components of the third switches with respect to the RF signal and the RF ground.

According to one aspect of the embodiment, the method may further tapering the plurality of third switches in size from one of the third switches proximate to one of the transmit port or the RF ground toward another one of the third switches proximate to the other one of the transmit port or the RF ground.

According to one aspect of the embodiment, the method may further include sizing the plurality of third switches such that a voltage of the RF signal across the plurality of third switches is evenly divided while transmitting the RF signal.

Additional aspects and/or features of the present invention will be set forth in the description which follows.

BRIEF DESCRIPTION OF THE DRAWINGS

The features and aspects of embodiments of the present invention will be more apparent from the following detailed description in conjunction with the accompanying drawings, in which.

DETAILED DESCRIPTION

Exemplary embodiments will now be described more fully hereinafter with reference to the accompanying drawings. As those skilled in the art would realize, the described embodiments may be modified in various different ways, all without departing from the spirit or scope of the present invention.

Figure 1:
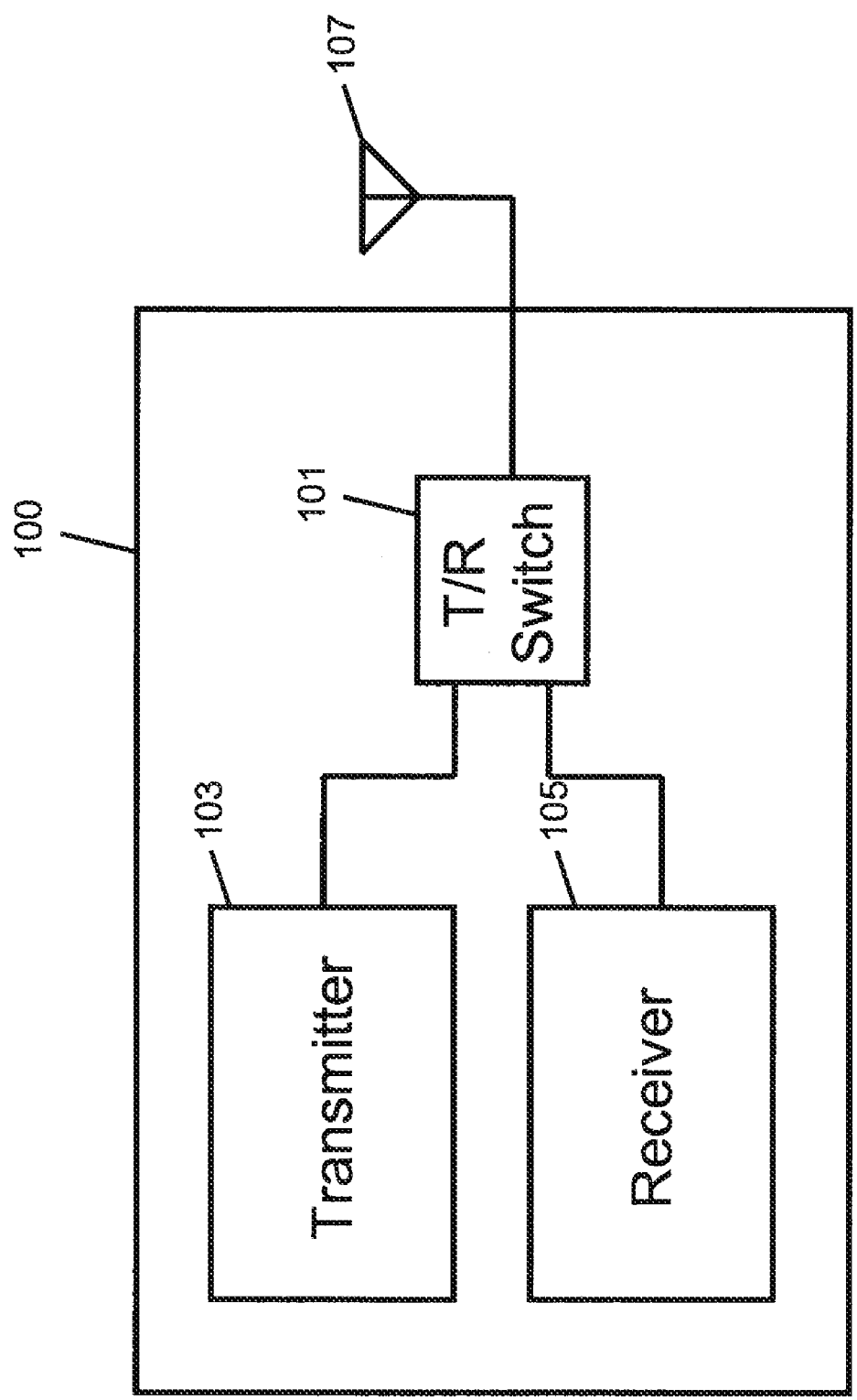
FIG. 1 is a conceptual block diagram of an RF transceiver featuring a single transmit and single receive path.

Among the many requirements in high power radio transceiver design, an effective design directs the high power transmit signal to an antenna (e.g., 107 in FIG. 1), and prevents that high power signal from entering the sensitive front end of the local receiver (e.g., 105 in FIG. 1), while also providing a low-loss connection between the antenna and the receiver. High power transceiver design comes in various architectures. In a design where the transmitter and the receiver operate on different frequencies, a device that implements frequency domain multiplexing such as a filter network (e.g., a diplexer) may be placed between the antenna, transmitter output, and receiver input such that the filter network separates and directs the transmit and receive signals to the antenna and the receiver, respectively.

However, the frequency domain multiplexing approach cannot be used in systems that utilize the same frequency for transmit and receive signals. For this type of transceivers, a T/R switch configured in solid state switches (e.g., transistors, PIN diodes) on a monolithic integrated circuit may be included in a transceiver to switch the transmit and receive signals appropriately.

Figure 2:
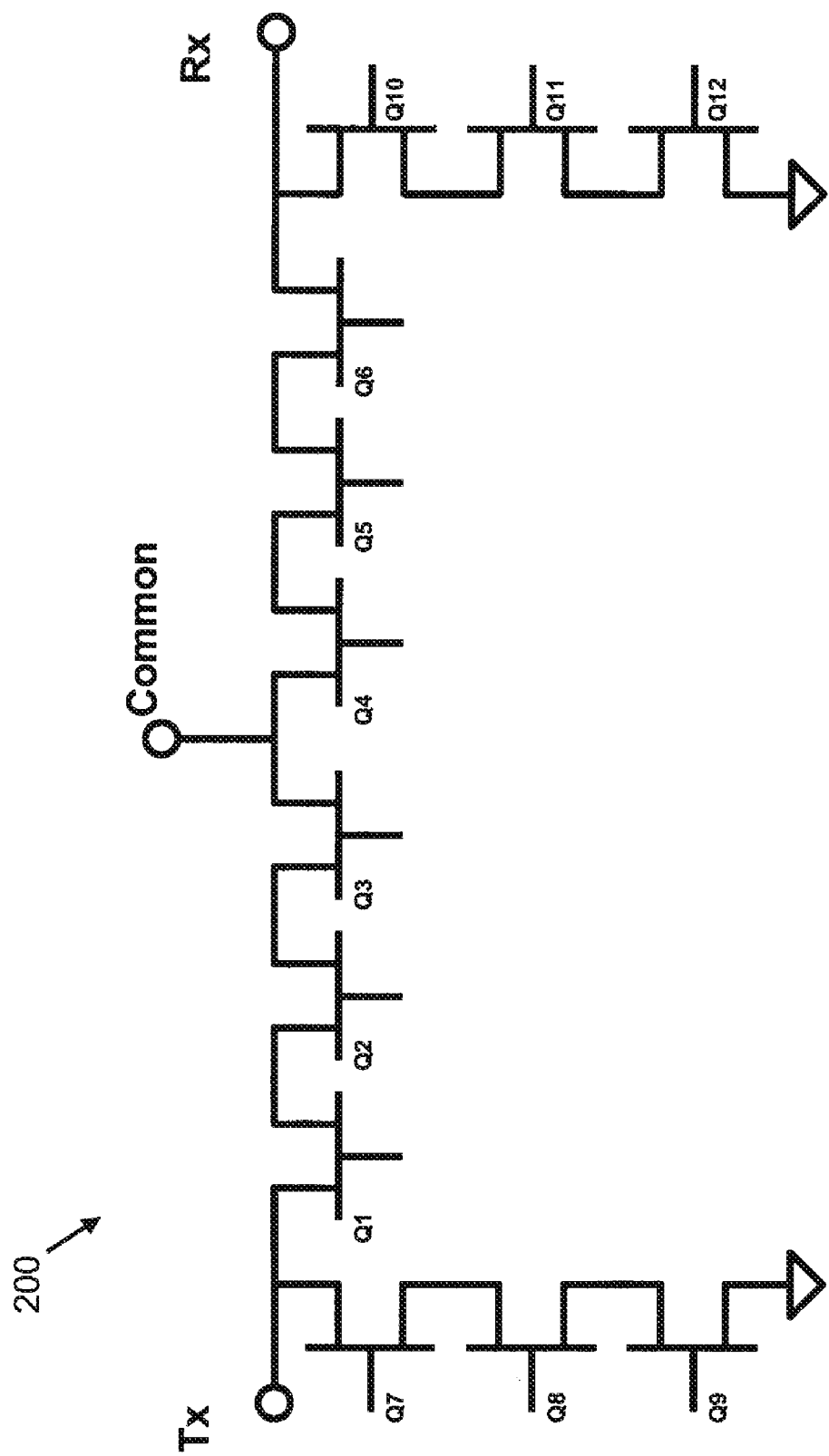
FIG. 2 is a schematic diagram illustrating a plurality of switches of a high power T/R switch.

FIG. 2 is a schematic diagram of a high power T/R switch 200 implemented with a plurality of FET transistors.

Referring to FIG. 2, the T/R switch 200 may be fabricated as an integrated circuit or with discrete transistors and includes both series and shunt FETs (three FETs in each path in FIG. 2) in both the transmit (Tx) and receive (Rx) paths. When the T/R switch 200 is fabricated as an integrated circuit, generally known methods for fabricating RF integrated circuit may be used to create the T/R switch 200. In transmit mode, suitable gate voltages are applied to FET transistors Q1, Q2, Q3, Q10, Q11, and Q12 to turn these FET transistors on, while FET transistors Q4, Q5, Q6, Q7, Q8, and Q9 are turned off. During the transmit mode, the RX port is shunted to ground by the FET transistors Q10-Q12, therefore, FETs transistors Q4-Q6 are effectively connected in series between the common port and ground. As such, in high power applications, the voltage breakdown ratings of FET transistors Q4-Q6 limit the power handling capacity of the T/R switch 200. Although stacking (i.e., connected in series) the FET transistors as shown in FIG. 2 increases the total power handling capacity of the T/R switch by voltage dividing the total voltage across the FET transistors of the stack, the ground parasitic components of the FET transistors (e.g., Q4-Q6) may cause an uneven voltage division among the FETs to occur, thereby subjecting the FETs in a stack to unequal stress. The parasitics added across the stack causes varying RF impedances reference to ground to occur along the stack of FETs.

Figure 3:
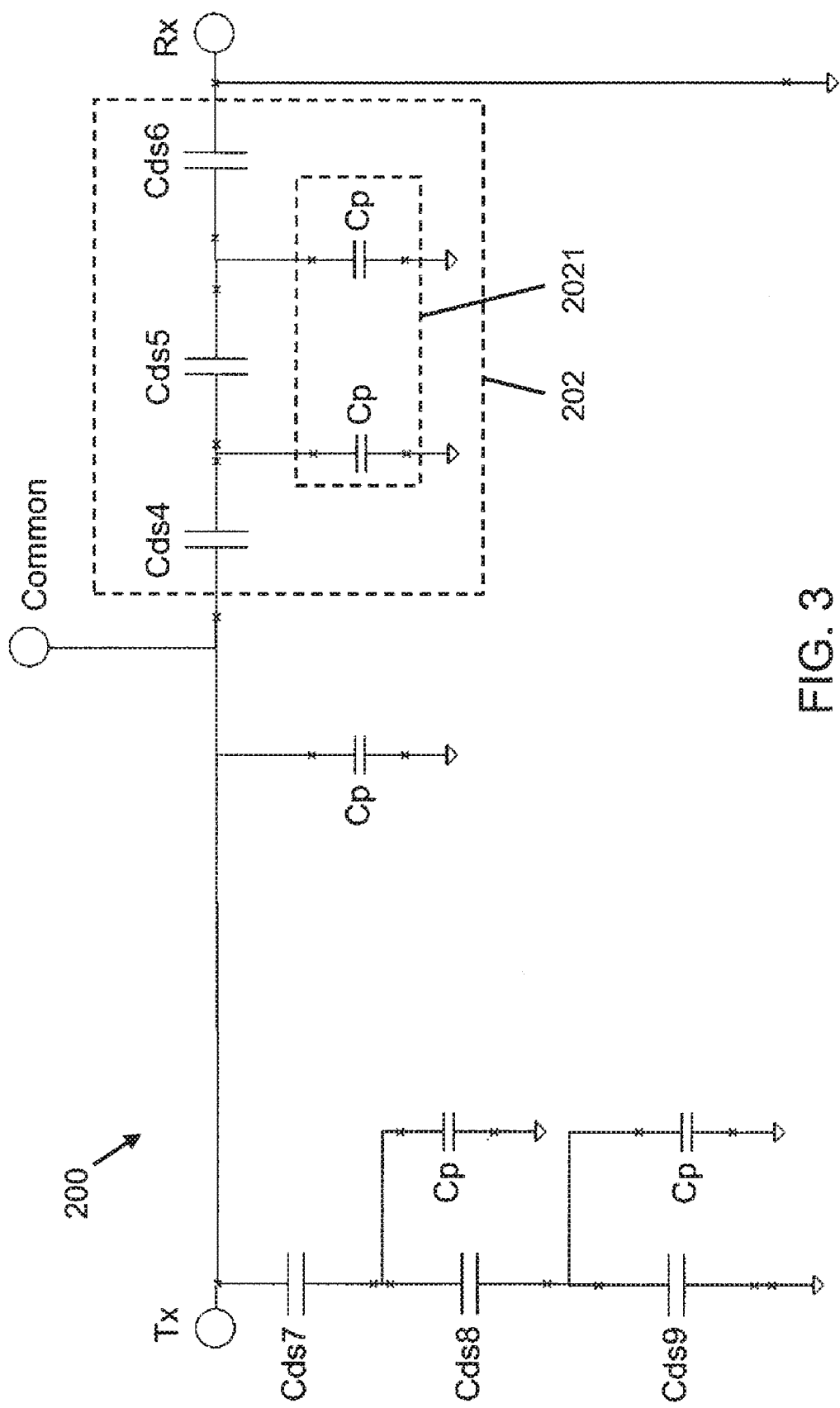
FIG. 3 is a schematic diagram illustrating an equivalent circuit of shunt transistors of the T/R switch of FIG. 2 including parasitic components when the T/R switch is in Transmit mode.

FIG. 3. is a schematic circuit diagram illustrating an equivalent circuit 202 of the FET transistors Q4-Q6 including their ground parasitic components 2021 when the T/R switch 200 is operating in the transmit mode.

As shown in FIG. 3, the impedance seen by Q4 (Cds4) with reference to ground is different then the impedance seen by Q5 (Cds5) with reference to ground, which results in unequal voltage division across the stack.

While it is known that discrete capacitors may be connected across the drain and source terminals of FET transistors Q4-Q6 to equalize the voltage division among the transistors, this approach utilizes additional components and increases layout complexity of the integrated circuit.

According to one embodiment of the present invention, the FET transistors Q4-Q6 are fabricated as an integrated circuit in which the periphery sizes of the FET transistors Q4-Q6 may be increased to achieve the same effect as adding the discrete capacitors across the drain to sources of each FET. Increasing the periphery size of a switching device inherently increases the device's parasitic capacitance and achieves the same result as adding discrete capacitors. Increasing the periphery size of the switching device increases the corresponding layout area occupied by the switching device, thereby increasing its parasitic capacitance. Further, increasing the periphery size of the switching device has the additional benefit of creating a lower loss Rx path since the on-resistance (Ron) of the switching device scales down with increasing periphery size, and therefore the total series resistance of FET transistors Q4-Q6 will be less when they are turned on in the Rx mode.

According to one embodiment, the active device area may be tapered in size appropriately along the stack to equalize the voltages across FET transistors Q4-Q6. Non-linear simulations may be used to accurately simulate the appropriate capacitance at each device location which then may be implemented with a corresponding increase in active device size.

Figure 4:
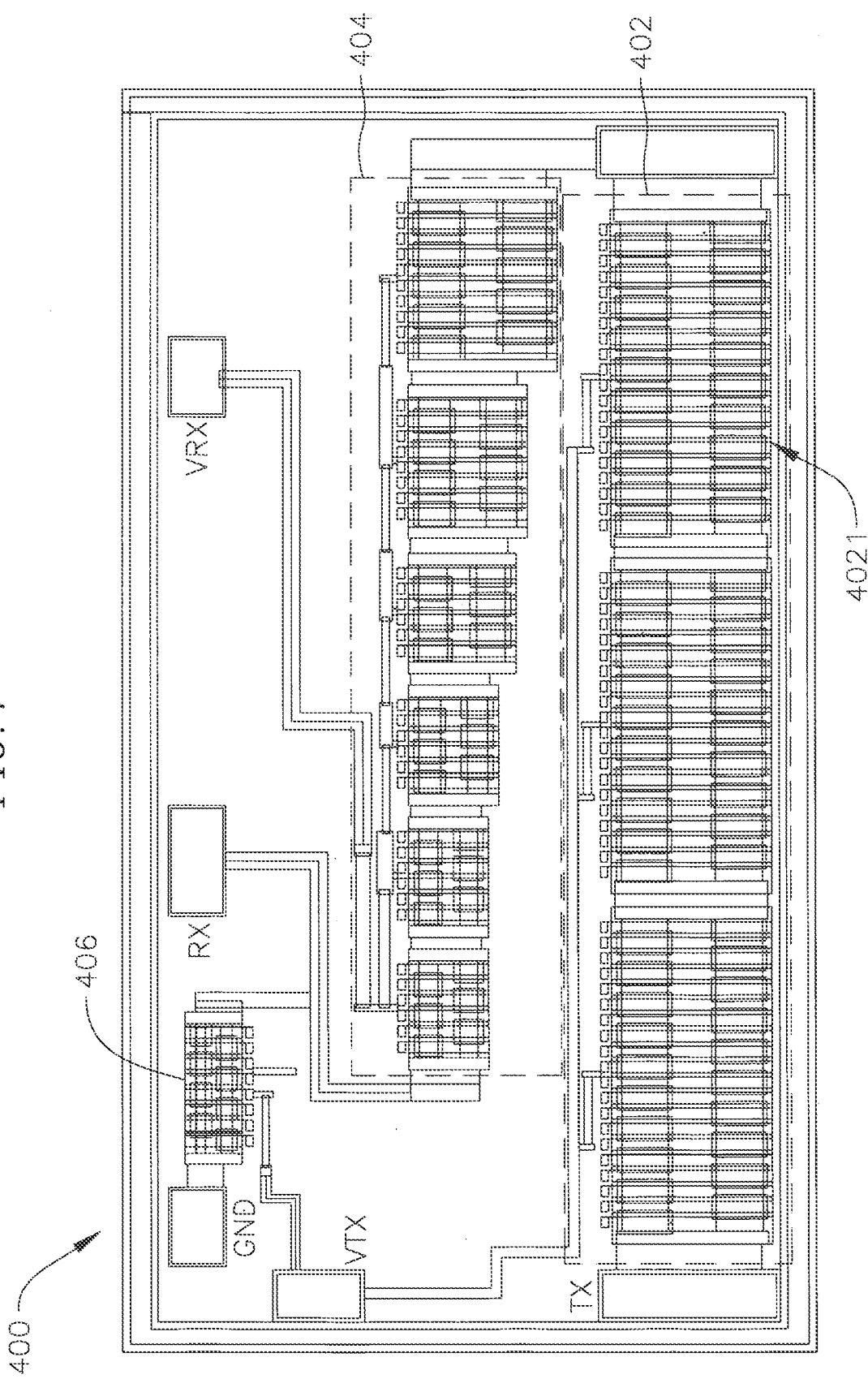
FIG. 4 is a monolithic integrated circuit layout of a T/R switch according to one embodiment of the present invention.

FIG. 4 is a circuit layout of a T/R switch 400 according to one embodiment of the present invention.

A circuit layout is the representation of an integrated circuit in terms of planar geometric shapes which correspond to the patterns of metal, oxide, or semiconductor layers that make up the components of the integrated circuit. The characteristic of the final integrated circuit depends largely on the topologies and interconnections of the geometric shapes.

Referring to FIG. 4, the layout shows the equal sized FETs 402 in the COM to Tx path and the tapered FETs 404 in the COM to Rx path. A shunt FET 406 is placed on the Rx port. Lumped element and distributed simulations were performed with Applied Wave Research's Microwave Office high-frequency design platform. S-parameters and node voltage analyses were run with lumped element FET models.

In FIG. 4, the plurality of FET transistors 404 connected in series in the Rx path are tapered in size. The tapering sizes may be chosen based on large signal analysis of a high power state of the T/R switch in Tx mode. In FIG. 4, there are a total of six FETs 404 in the series Rx path with the largest FET 4021 being at the common node.

Figure 5:
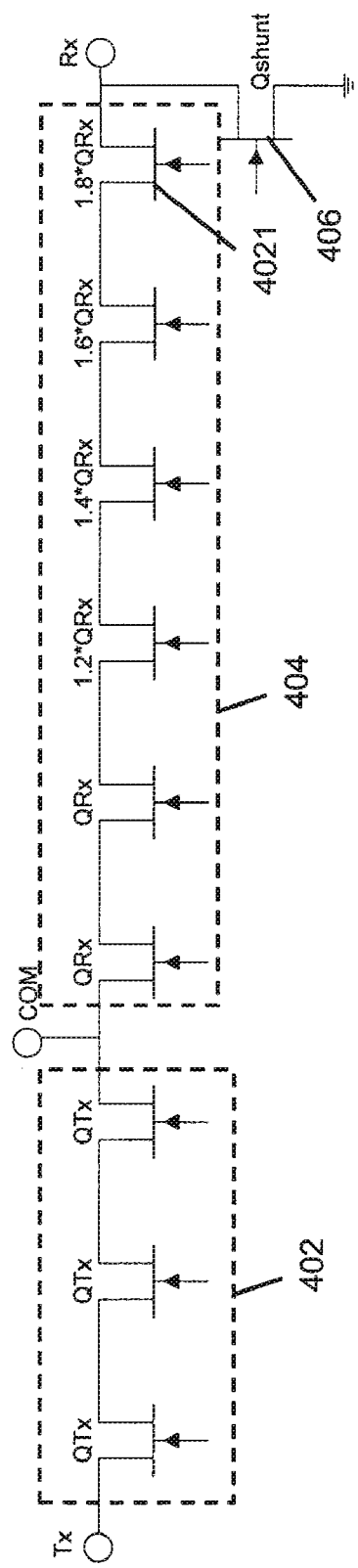
FIG. 5 is an equivalent circuit schematic of the T/R switch of FIG. 4.

FIG. 5 is an equivalent circuit schematic of the T/R switch 400 of FIG. 4. In the embodiment of FIG. 5, there are no shunt FET between the Tx port and ground. The FETs 402 between the Tx port and the Common port have equal sizes, and the FETs 404 have increasing sizes from the Common port to the Rx port. According to one embodiment, the sizes of the FETs 404 have a ratio of 1:1:1.2:1.4:1.6:1.8, with the largest FET being closest to the Rx port. However, the present invention is not limited thereto.

Figure 6:
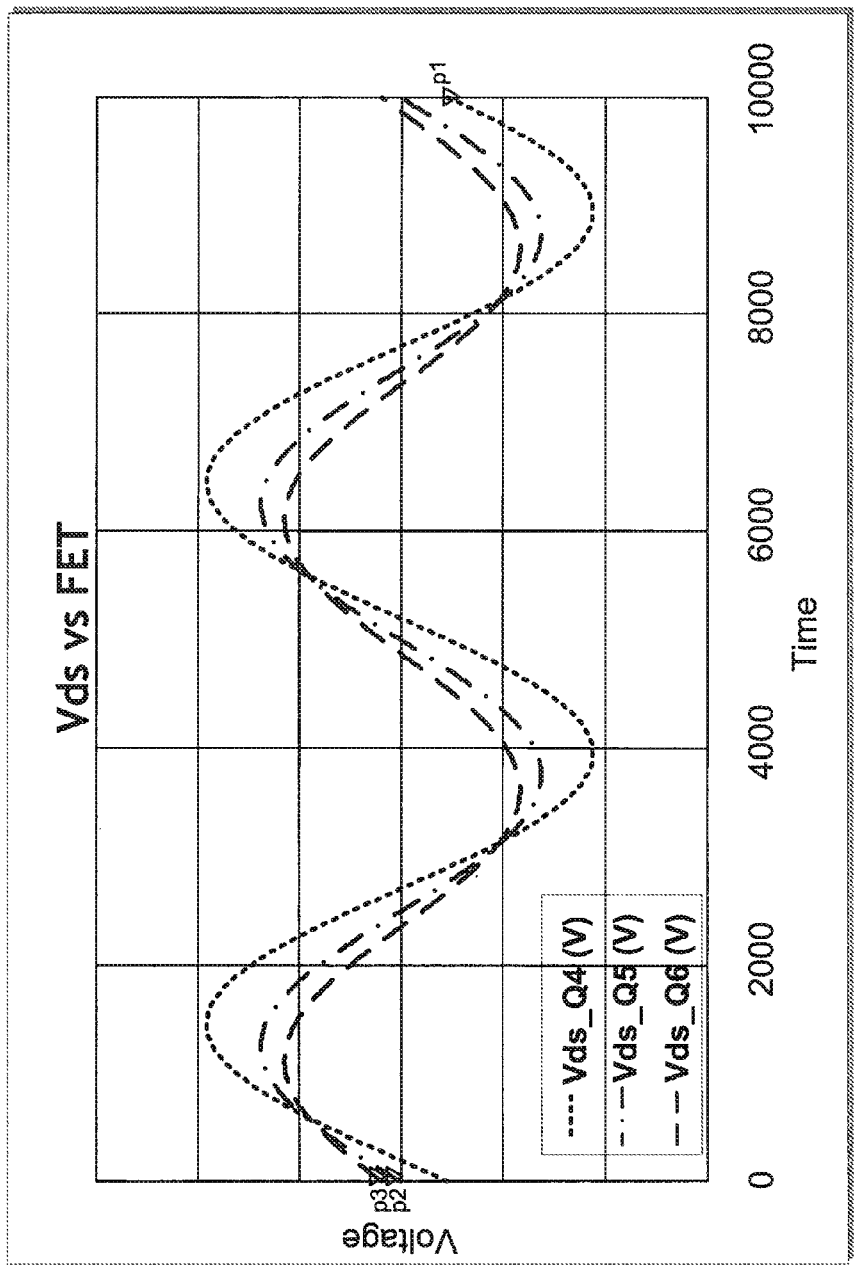
FIG. 6 is a graphical representation of the drain to source voltage swings across Q4, Q5, Q6 in FIG. 2 when the Common to Rx path is enabled and no series FET size tapering is implemented.
Figure 7:
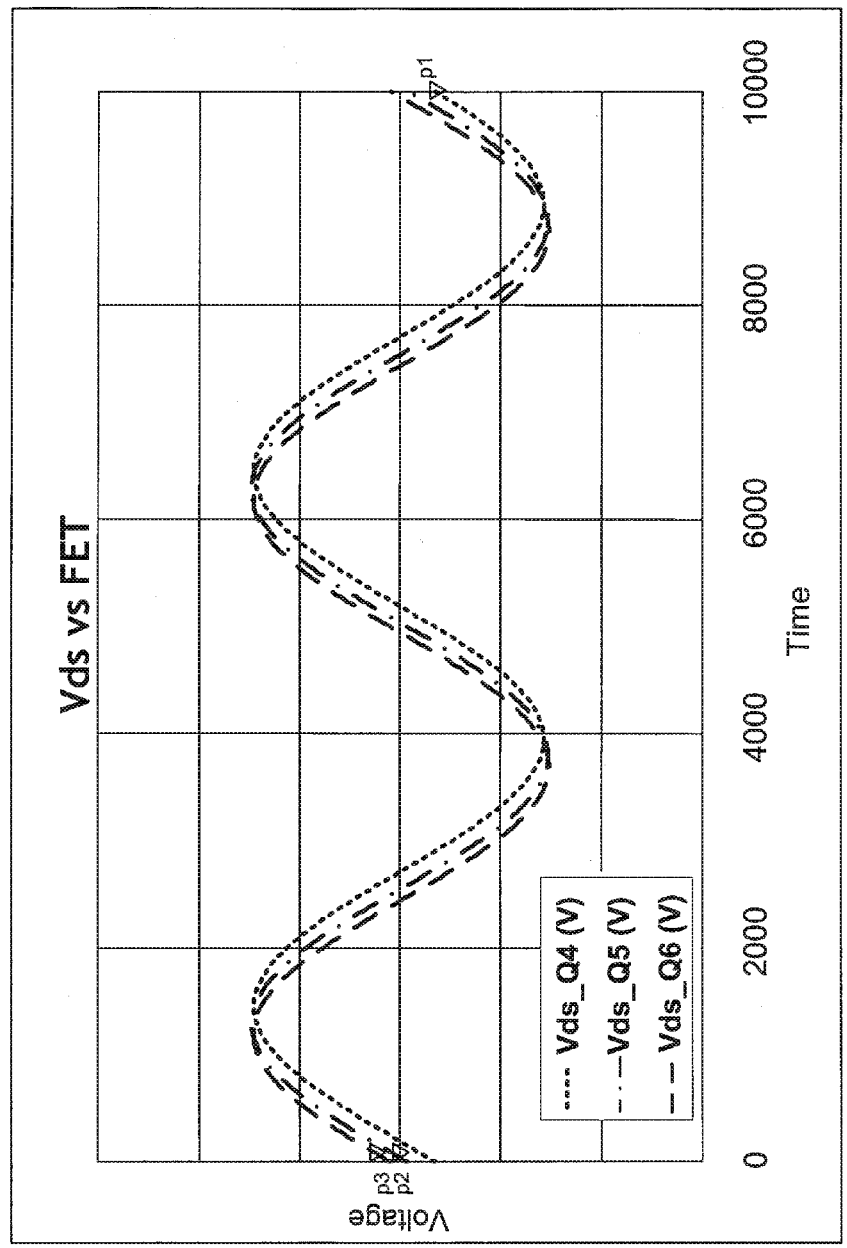
FIG. 7 is a graphical representation of the drain to source voltage swings across Q4, Q5, Q6 in FIG. 2 when the Common to Rx path is enabled and series FET size tapering is implemented.

FIG. 6 and FIG. 7 are graphs showing simulated FET voltage swings before and after tapering of the Rx path FETs Q4, Q5, and Q6 of FIG. 2.

As shown in FIGS. 6 and 7, the voltage swings among FETs Q4, Q5, and Q6 are substantially reduced with tapering.

As shown in the above embodiments of the present invention, the voltages across the shunt transistors in the RX path are substantially equalized by tapering the sizes of the transistors. Therefore, the effect of the ground parasitic components of the series transistors in a shunt to ground may be compensated for. While the above embodiments are shown with FET transistors as the switching elements, the present invention is not limited thereto, and the embodiments may be modified to use other suitable switching elements such as PIN diodes, BJT, and other suitable switches.

While the above described embodiments illustrate an R/F switch embodied in an integrated circuit, one skilled in the art will appreciate that the present invention is not limited thereto. To the contrary, the present invention may be implemented with discrete switching elements. Furthermore, while the above described embodiments illustrate a single Tx path and a single Rx path, the present invention is not limited thereto. In some embodiments, the R/F switch may include multiple Tx paths and/or multiple Rx paths connected to one or more antenna. As such, in some embodiments, a plurality of transmitter may share one antenna via different Tx paths, or a transmitter may transmit via different Tx paths to a plurality of antennas with different polarizations.

Although exemplary embodiments of the present invention have been illustrated, it should be understood that many variations and modifications may be made in those embodiments without departing from the spirit and scope of the present invention as set forth in the following claims and their equivalents.

What is claimed is:

1. An RF switch comprising:
   a plurality of first switches coupled in series between a transmit port and a common port for transmitting an RF signal; and
   a plurality of second switches coupled in series between a receive port and the common port,
   wherein the sizes of the plurality of second switches have a ratio of 1:1:1.2:1.4:1.6:1.8 such that the second switches have substantially the same nodal impedance with respect to a frequency of the RF signal and an RF ground, and parasitic components of the second switches with respect to the RF signal and the RE ground are compensated.

2. The RF switch of claim 1, wherein the plurality of second switches are tapered in size from one of the second switches proximate to one of the receive port or the common port toward another one of the second switches proximate to the other one of the receive port or the common port.

3. The RF switch of claim 1, wherein the plurality of second switches is sized such that a voltage of the RF signal across the plurality of second switches is evenly divided while transmitting the RF signal.

4. The RF switch of claim 1, wherein the plurality of second switches comprises a plurality of transistors.

5. The RF switch of claim 1, wherein the plurality of second switches comprises PIN diodes.

6. The RF switch of claim 1, further comprising a plurality of third switches coupled in series between the transmit port and the RF ground,
   wherein at least two of the plurality of third switches have different sizes such that the at least two of the third switches have substantially the same nodal impedance with respect to the frequency of the RF signal.

7. The RF switch of claim 6, wherein the plurality of third switches have different sizes to compensate for parasitic components of the third switches with respect to the RF signal and the RF ground.

8. The RF switch of claim 7, wherein the plurality of third switches are tapered in size from one of the third switches proximate to one of the transmit port or the RF ground toward another one of the third switches proximate to the other one of the transmit port or the RF ground.

9. The RF switch of claim 6, wherein the plurality of third switches comprises transistors.

10. The RF switch of claim 6, wherein the plurality of third switches comprises PIN diodes.

11. The RF switch of claim 6, wherein the plurality of third switches is sized such that a voltage of the RF signal across the plurality of third switches is evenly divided while transmitting the RF signal.

12. The RF switch of claim 1, wherein the first switches and the second switches are discrete switches.

13. A method of manufacturing an RF switch, the method comprising:
   coupling a plurality of first switches in series between a transmit port and a common port for transmitting an RF signal; and
   coupling a plurality of second switches in series between a receive port and the common port,
   wherein the sizes of the plurality of second switches have a ratio of 1:1:1.2:1.4:1.6:1.8 such that the second switches have substantially the same nodal impedance with respect to a frequency of the RF signal and an RF ground and parasitic components of the second switches with respect to the RF signal and the RF ground are compensated.

14. The method of claim 13, further comprising tapering the plurality of second switches in size from one of the second switches proximate to one of the receive port or the common port toward another one of the second switches proximate to the other one of the receive port or the common port.

15. The method of claim 13, further comprising sizing the plurality of second switches such that a voltage of the RF signal across the plurality of second switches is evenly divided while transmitting the RF signal.

16. The method of claim 13, wherein the plurality of second switches comprises a plurality of transistors.

17. The method of claim 13, wherein the plurality of second switches comprises PIN diodes.

18. The method of claim 13, further comprising coupling a plurality of third switches in series between the transmit port and the RF ground,
   wherein at least two of the plurality of third switches have different sizes such that the at least two of the third switches have substantially the same nodal impedance with respect to the frequency of the RF signal.

19. The method of claim 18, further comprising sizing the plurality of third switches differently to compensate for parasitic components of the third switches with respect to the RF signal and the RF ground.

20. The method of claim 19, further comprising tapering the plurality of third switches in size from one of the third switches proximate to one of the transmit port or the RF ground toward another one of the third switches proximate to the other one of the transmit port or the RF ground.

21. The method of claim 18, wherein the plurality of third switches comprises transistors.

22. The method of claim 18, wherein the plurality of third switches comprises PIN diodes.

23. The method of claim 18, further comprising sizing the plurality of third switches such that a voltage of the RF signal across the plurality of third switches is evenly divided while transmitting the RF signal.

24. The method of claim 13, wherein the first switches and the second switches are discrete switches.

* * * * *